(12) United States Patent
Kelso et al.

(10) Patent No.: US 8,883,055 B2
(45) Date of Patent: Nov. 11, 2014

(54) LUMINESCENT CERAMIC CONVERTER AND METHOD OF MAKING SAME

(75) Inventors: John F. Kelso, Exeter, NH (US); Nathan Zink, Salem, MA (US)

(73) Assignee: OSRAM SYLVANIA Inc, Danvers, MA (US)

( * ) Notice: Subject to any disclaimer, the term of this patent is extended or adjusted under 35 U.S.C. 154(b) by 313 days.

(21) Appl. No.: 13/522,049

(22) PCT Filed: Jan. 27, 2011

(86) PCT No.: PCT/US2011/022715
§ 371 (c)(1),
(2), (4) Date: Jul. 13, 2012

(87) PCT Pub. No.: WO2011/094404
PCT Pub. Date: Aug. 4, 2011

(65) Prior Publication Data
US 2012/0326344 A1    Dec. 27, 2012

Related U.S. Application Data

(60) Provisional application No. 61/298,940, filed on Jan. 28, 2010.

(51) Int. Cl.
| | | |
|---|---|---|
| *C09K 11/77* | (2006.01) | |
| *C04B 35/44* | (2006.01) | |
| *C04B 35/638* | (2006.01) | |
| *C04B 38/00* | (2006.01) | |
| *C04B 35/626* | (2006.01) | |
| *C04B 111/80* | (2006.01) | |
| *H01L 33/50* | (2010.01) | |

(52) U.S. Cl.
CPC ..... *C09K 11/7774* (2013.01); *C04B 2235/3224* (2013.01); *C04B 2235/6588* (2013.01); *C04B 2235/6025* (2013.01); *C04B 2235/6567* (2013.01); *C04B 35/44* (2013.01); *C04B 2111/807* (2013.01); *C04B 35/638* (2013.01); *H01L 33/502* (2013.01); *C04B 2235/6562* (2013.01); *C04B 38/00* (2013.01); *C04B 2235/6582* (2013.01); *C04B 35/6263* (2013.01); *C04B 2235/3225* (2013.01); *C04B 2235/764* (2013.01); *C04B 2235/6565* (2013.01); *C04B 2235/3229* (2013.01); *C04B 2235/656* (2013.01)
USPC .......................................................... 264/44

(58) Field of Classification Search
CPC .......................... C04B 35/505; C04B 38/0051
See application file for complete search history.

(56) References Cited

U.S. PATENT DOCUMENTS

| | | | |
|---|---|---|---|
| 6,967,222 B2 | 11/2005 | Khanarian et al. | |
| 8,113,675 B2 * | 2/2012 | Bechtel et al. | 362/84 |

(Continued)

FOREIGN PATENT DOCUMENTS

| | | |
|---|---|---|
| BY | 12457 | 10/2009 |
| JP | 62-176970 | 8/1987 |

(Continued)

OTHER PUBLICATIONS

Gain, Asit K. et. al. "Microstructure and mechanical properties of porous yttria stabilized zirconia ceramic using poly methyl methacrylate powder." Scripta Materialia 54 (2006) 2081-2085.*

(Continued)

*Primary Examiner* — Joseph S Del Sole
*Assistant Examiner* — Russell Kemmerle, III
(74) *Attorney, Agent, or Firm* — Robert F. Clark

(57) ABSTRACT

The present invention relates to a luminescent ceramic converter comprising a sintered, monolithic ceramic material that converts a light of a first wavelength to a light of a second wavelength, the ceramic material having substantially spherically shaped pores. The present invention also relates to methods for the manufacture of the luminescent ceramic converter that comprises the ceramic material having substantially spherically shaped pores.

10 Claims, 2 Drawing Sheets

(56) References Cited

U.S. PATENT DOCUMENTS

| | | | |
|---|---|---|---|
| 8,256,914 B2* | 9/2012 | Bechtel et al. | 362/84 |
| 2004/0145308 A1 | 7/2004 | Rossner et al. | |
| 2006/0116000 A1* | 6/2006 | Yamamoto | 438/795 |
| 2008/0187746 A1 | 8/2008 | De Graaf et al. | |
| 2009/0020897 A1* | 1/2009 | Winkler et al. | 264/1.22 |
| 2009/0066221 A1* | 3/2009 | Schmidt et al. | 313/503 |
| 2010/0067233 A1* | 3/2010 | Bechtel et al. | 362/260 |
| 2010/0276717 A1 | 11/2010 | Boerkekamp et al. | |
| 2012/0134134 A1* | 5/2012 | Bechtel et al. | 362/84 |

FOREIGN PATENT DOCUMENTS

| | | |
|---|---|---|
| JP | 07-291759 | 11/1995 |
| JP | 2003-131001 | 5/2003 |
| JP | 2004-300026 | 10/2004 |
| JP | 2007-217254 | 8/2007 |
| WO | WO 2006/097876 | 9/2006 |
| WO | WO 2007/107917 | 9/2007 |
| WO | WO 2008/056292 | 5/2008 |
| WO | 2008/153749 | 12/2008 |
| WO | WO 2009/090580 | 7/2009 |

OTHER PUBLICATIONS

Sim, S. M. et al. "Phase formation in yttrium aluminum garnet powders synthesized by chemical methods." J. of Materials Sci vol. 35 isue 3 (2000) 713-717.*
Abstract BY 12457.
Machine translation JP2007-217254.
Partial translation JP62-176970.
Machine translation JP07-291759.
Machine translation JP2004-300026.

\* cited by examiner

LUMINESCENT CERAMIC CONVERTER AND METHOD OF MAKING SAME

CROSS REFERENCE TO RELATED APPLICATIONS

This application claims the benefit of U.S. Provisional Application No. 61/298,940, filed Jan. 28, 2010.

TECHNICAL FIELD

This invention relates to ceramic converters for converting the light emitted from a light source into a light of a different wavelength. In particular, this invention relates phosphor-conversion light emitting diodes (pc-LEDs) and associated luminescent ceramic converters.

BACKGROUND OF THE INVENTION

Luminescent ceramic converters typically are used in white-light-emitting pc-LEDs to convert a portion of the blue light emitted from an InGaN LED semiconductor die (or chip) into a yellow light. The remaining unconverted blue light that passes through the converter and the yellow light emitted by the converter combine to generate an overall white light emission from the pc-LED. The luminescent ceramic converter in a pc-LED device is typically a thin, flat plate of a dense, luminescent ceramic that is affixed to the surface of the LED chip so that the plate is in close proximity to the light emitting surface. For white light generation, the material of the converter is usually based on cerium-activated yttrium aluminum garnet ($Y_3Al_5O_{12}$), also referred to as YAG:Ce. Gadolinium may also be incorporated into the YAG structure to slightly shift the color of the emitted light (Gd-YAG:Ce). The addition of a cerium activator to the ceramic provides the means for light conversion. The cerium partially absorbs the blue light (wavelength of about 420-490 nm) emitted by the LED and re-emits yellow light with a broad peak around 570 nm. The mixture of the blue and yellow light renders the desired white light.

Color uniformity is an important aspect for the white light output by a pc-LED. For example, in automotive headlamp applications, the color uniformity of the beam projected on the road is important so that the headlamp is in compliance with SAE and ECE requirements. One key factor in projecting a beam of uniform color is that the LED package outputs light that shows minimal shift in color as the viewing angle varies around the LED. This however is not a trivial problem that is easily overcome.

The color of the light emitted by the pc-LED depends on the ratio of the amounts of unabsorbed blue light and converted yellow light which is affected by the path length the light travels within the converter. In particular, when the light emitted from the underlying blue LED travels through the ceramic converter, the light rays traveling normal to the chip surface have a shorter path to the light emitting surface of the converter than the light rays travelling through the ceramic converter at angles farther from normal. The amount of absorption (and subsequent re-emission at longer wavelength) follows the Beer-Lambert Law which shows an exponential dependence on both concentration and thickness:

$$I/I_o = 10^{-\epsilon ct} \quad (1)$$

where $I_o$ and I are the intensities of the incident and transmitted light, $\epsilon$ is the molar absorptivity of the absorber, c is the concentration of the absorber, and t is optical path length through the material.

Consequently, blue light travelling through the ceramic converter at angles farther from normal will be absorbed more strongly because of the longer optical path length in the material. This results is less blue light and more yellow light exiting the converter at larger angles thereby producing an overall emission that has a greater proportion of yellow light than the light emitted normal to the surface of the converter.

One solution to reduce the difference in angular color shift is to create a longer optical path for all light rays within the converter by introducing scattering sites in the form of pores in the ceramic material. Most ceramics are made by sintering a formed compaction of powders which contain a certain amount and size distribution of void space, referred to as "pores," between the powder particles. These pores formed by the inter-particle spacing in the ceramic body are commonly referred to as matrix pores. The sintering process essentially brings the centers of the powder particles closer together, removes the porosity to some extent, and grows the grain size of the crystals in the ceramic material. Rather than trying to eliminate the porosity, the sintering temperature or sintering time may lowered so that the matrix pores are not all eliminated during the densification of the ceramic.

One drawback of using pore scattering in reducing the angular color shift is the reduction in efficacy associated with the excessive scattering by the pores. The effectiveness of the scattering will be determined by both the concentration and size of the pores in the ceramic. If the concentration of the pores is too high, the light will be substantially absorbed by the internal scattering and the overall LED output will be reduced.

The effect of pore size on the efficacy is reported as optimal with pores of diameter of about 800 nm in International Patent Application No. WO 2007/107917. The efficacy drops off rapidly with pore sizes below 500 nm and steadily for pore sizes above 1000 nm. However, it is difficult to control the size or the size distribution of the porosity through manipulation of the sintering cycle since too many factors, e.g., grain size, particle packing, grain growth, and sintering temperature, all influence the final pore population in the sintered ceramic converter. Thus, due to the thermodynamic and kinetic aspects of the ceramic processing, it is difficult to deliver a ceramic with the desired pore size and distribution.

SUMMARY OF THE INVENTION

It is an object of the invention to obviate the disadvantages of the prior art.

It is a further object of the invention to provide a reliable means of controlling and achieving the desired distribution and size of the pores in a luminescent ceramic converter.

In accordance with an object of the invention, there is provided a luminescent ceramic converter that comprises a sintered, monolithic ceramic material that converts light of a first wavelength to light of a second wavelength and has substantially spherically shaped pores for scattering light. Preferably, the pores may have an average pore size of 0.5 to 10 μm and more preferably an average pore size of 0.5 to 2 μm. The light of the first wavelength is preferably a blue light emitted by a light emitting diode and the ceramic material is preferably comprised of cerium-activated yttrium aluminum garnet. More preferably, the ceramic material may further contain gadolinium.

In accordance with another object of the invention, there is also provided a method of forming a luminescent ceramic converter comprising the steps of: (a) combining a precursor material with a pore-forming additive to form a green state mixture, the pore-forming additive comprising substantially spherical particles of a carbonaceous material or an organic material; (b) shaping the green state mixture to form a green state shape of the ceramic converter; (c) heating the green state shape to remove the pore-forming additive and form a pre-fired ceramic material having substantially spherical pores; and (d) sintering the pre-fired ceramic material to form the luminescent ceramic converters. Preferably, the precursor material may comprise cerium-activated yttrium aluminum garnet. The green state mixture may further contain an organic binder to aid in the formation of the green state shape. Methods for forming the green state shape include injection molding, tape casting, dry pressing, slip casting, or extrusion. Preferably, the organic material may be a polymer and more preferably the organic material may comprise poly(methacrylate)-co-ethylene glycol dimethacrylate (PMMA), polyethylene or polytetrafluoroethylene. The carbonaceous material may preferably comprise glassy spherical carbon powders.

In another aspect of the invention, the green state mixture may contain more than one precursor material and heating of the green state shape causes the precursor materials to react to form the luminescent ceramic converter. In a further aspect, the heating in step (c) may be performed at a temperature up to 1150° C. In yet another aspect, the heating in step (c) may be performed at a time-temperature cycle of: increasing temperature from 25° C. to 400° C. in 4 hours, increasing temperature from 400° C. to 1150° C. in 4 hours, holding the temperature at 1150° C. for a time period ranging from 0.5 to 2 hours, and decreasing the temperature to 25° C. in 3 hours.

Preferably, the pre-fired ceramic material is sintered at 1700° C.-1825° C. and more preferably the pre-fired ceramic material is sintered in a wet hydrogen atmosphere at 1700° C.-1825° C. for a time period ranging from 1 minute to 2 hours.

DETAILED DESCRIPTION OF THE INVENTION

Figure 1:
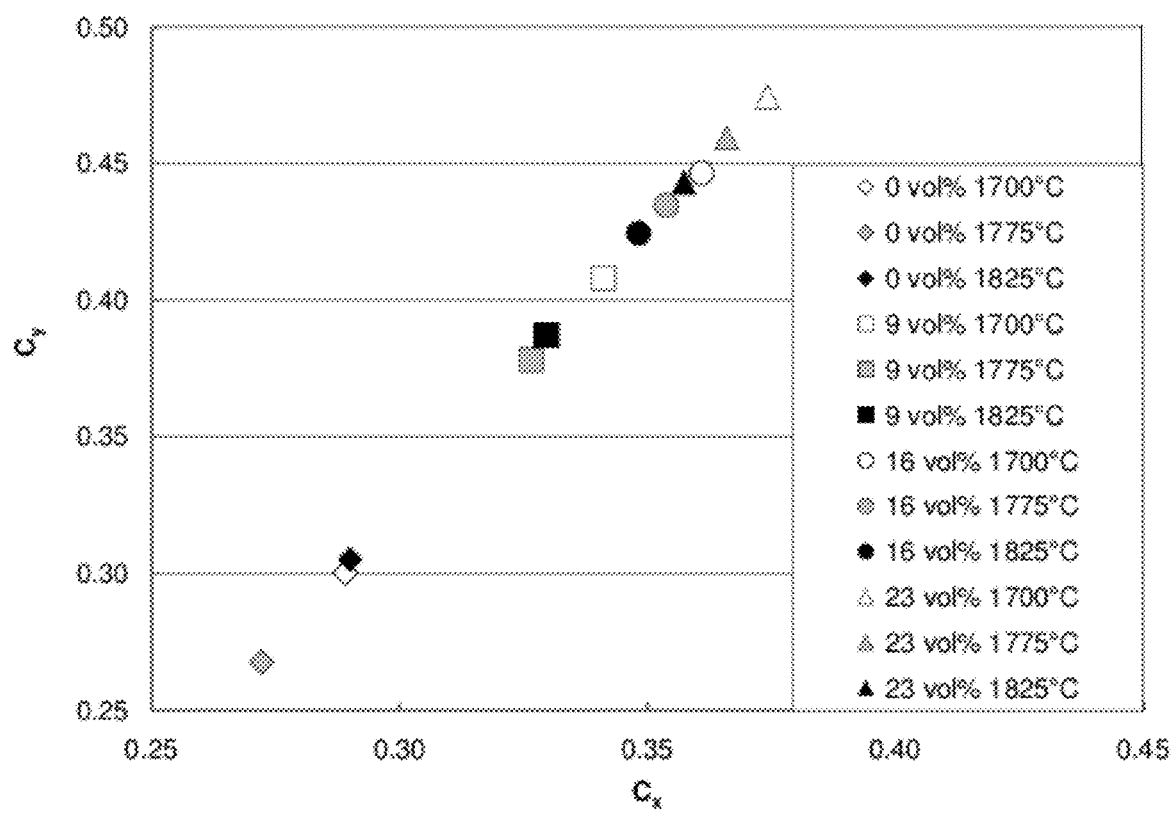
FIG. 1 is a plot of the $C_x$ and $C_y$ chromaticity coordinates of the light emitted by Gd-YAG:Ce ceramic converters prepared with different percentages of PMMA powder and sintered under different sintering temperatures.

For a better understanding of the present invention, together with other and further objects, advantages and capabilities thereof, reference is made to the following disclosure and appended claims taken in conjunction with the above-described drawings.

The use of pore-forming additives permits a controlled amount and size distribution of pores that depends on the choice of the pore-forming additive. If organic or carbonaceous particles of a controlled size and shape are added to the green precursor ceramic material as a pore-forming additive, they are subsequently removed or burned out during a heating process, leaving behind void spaces similar in size and shape to the starting additive. These voids then form pores of controlled sizes that are typically larger than sizes of the matrix pores. Unlike the matrix pores, the pores created by removing the additives are thermodynamically stable during high temperature treatment. For example, it is known that a pore size to grain size ratio controls the behavior of the pore removal during sintering. If the pore size is larger than 1.47 times the grain size, the pores are thermodynamically stable during sintering. Also, by using the additives, there is a higher degree of porosity control during the manufacture of the ceramic converter. This provides a way to control the pores in the ceramic converter which aids in reducing the angular color shift for ceramic converters on blue-light-emitting LEDs.

Preferably, the particles of the pore forming additive are substantially spherical, and have an average particle size of about 0.5 μm to about 10 μm, and more preferably 0.5 to 2 μm. The particle size measurements can be made with typical particle sizing techniques such as analysis of scanning electron micrographs, sedimentation with optical or X-ray scattering, or laser diffraction techniques. Particle size generally refers to the equivalent spherical diameter which neglects the morphological differences between particles. A substantially spherical shape is preferred for the pore-forming additive particles. Additive particles of other shapes, for example plate-like, tend to be aligned during casting and result in aligned pores with no advantage in controlling angular color shift.

The particles are preferably comprised of an organic or carbonaceous material that is substantially removed from the ceramic converter by thermal processing. Preferably, the organic material is PMMA (poly(methacrylate)-co-ethylene glycol dimethacrylate), micronized polyethylene wax (e.g., MPP-635XF available from Micro Powders Inc.), and polytetrafluoroethylene (e.g., Zonyl MP-1100 available from DuPont). Other clean-burning polymer or carbonaceous particles could be used including but not limited to styrene (Polysciences) and glassy spherical carbon powders (Sigma-Aldrich).

In one embodiment, a pore-forming additive made of poly (methacrylate)-co-ethylene glycol dimethacrylate (PMMA) is added during the green state. The terms "green state" and "green" mean that the ceramic material, ceramic part, ceramic microstructure or the shape of the ceramic converter has not yet been treated by any high temperature treatment. The PMMA additive contains well-formed substantially spherical particles with a mean size distribution of 8 μm. The additive is removed by treating the green ceramic material at a high temperature up to 1150° C. to form pores in the ceramic material. The pre-fired ceramic is then sintered at a temperature above 1700° C. During the sintering, the pores formed by the inter-particle spacing, i.e. matrix pores, are substantially reduced. In contrast, the pores formed by removing the pore-forming additive show little reduction when the sintering temperature is increased from 1700° C. to 1775° C.

Figure 2:
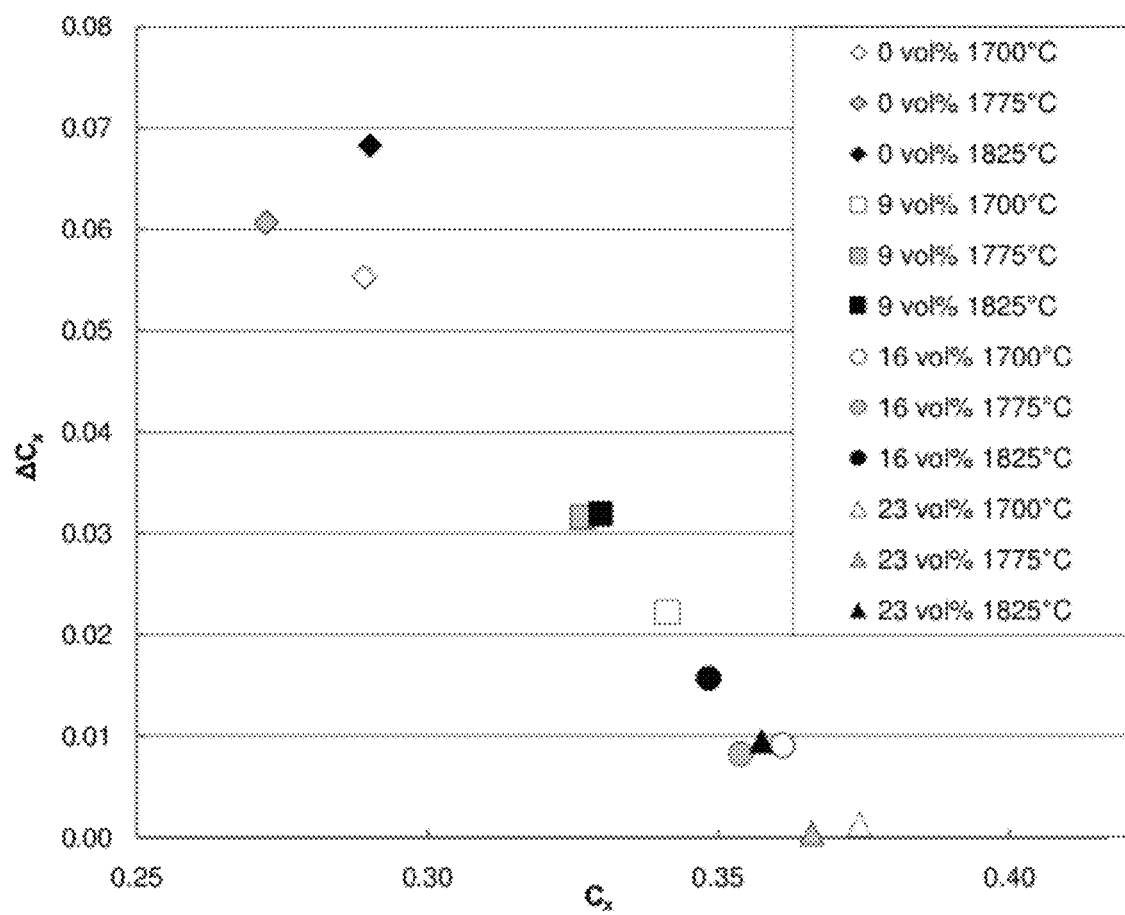
FIG. 2 is a plot of the angular color shifts of Gd-YAG:Ce ceramic converters prepared with different percentages of PMMA powder and sintered under different sintering temperatures, wherein $\Delta C_x$ is the difference between the chromaticity coordinate $C_x$ measured at a angle of viewing of 60 degrees from normal and the chromaticity coordinate $C_x$ measured at a angle of viewing of 0 degrees from normal.

The effects of the pore-forming additive level are studied by comparing the ceramic samples with no pore-forming additive and 9, 16 and 23 volume % (sintered volume) of added PMMA pore-forming additives. The resulting color of the light converted by the Gd-YAG:Ce ceramic converter prepared with different percentages of PMMA powder and under different sintering temperatures are shown in FIG. 1. As the amount of pore-forming additive increases and as the sintering temperature decreases, the color of the light shifts toward the yellow region (upright corner of the chromaticity diagram) due to increased light scattering from pores which increases the optical path length causing more blue absorption and yellow emission. FIG. 2 shows how the pore-forming additive reduces the angular color shift, as quantified by $\Delta C_x$ which is the difference between the chromaticity coordinate $C_x$ measured at a angle of incidence of 60 degree and the chromaticity coordinate $C_x$ measured at a angle of incidence of 0 degree. As the amount of pore-forming additive increases from 0% to 23%, the angular color shift is significantly reduced as shown in FIG. 2.

In a preferred method, a typical tape casting batch formula for YAG-based sintered ceramic converter plates as shown in Table 1 is used. Significant variations in the levels of cerium and gadolinium can be utilized to make a variety of colors and amount of conversion with a given ceramic converter thickness. The YAG converter plates can be made from a mixture of the individual oxides or by batching pre-reacted Gd-YAG:Ce powders.

TABLE 1

Aqueous tape casting batch** for $(Y_{0.796}Gd_{0.2}Ce_{0.004})_3Al_5O_{12}$

| Component | Weight % Solids | Density | Volume Percent | Volume (cm) | Weight Percent | Weight (g) |
|---|---|---|---|---|---|---|
| Water | 0% | 1.00 | 66.68% | 48.61 | 40.90% | 48.49 |
| WB4101 | 35% | 1.03 | 12.84% | 9.36 | 8.13% | 9.64 |
| DF002 | 100% | 1.20 | 0.31% | 0.23 | 0.23% | 0.27 |
| DS001 | 100% | 1.03 | 1.84% | 1.34 | 1.16% | 1.38 |
| PL005 | 100% | 1.03 | 0.92% | 0.67 | 0.58% | 0.69 |
| NH4OH | 100% | 1.00 | 0.95% | 0.69 | 0.58% | 0.69 |
| Y2O3 | 100% | 5.01 | 6.67% | 4.86 | 20.54% | 24.35 |
| Al2O3 | 100% | 3.97 | 7.95% | 5.80 | 19.42% | 23.02 |
| Gd2O3 | 100% | 7.41 | 1.82% | 1.33 | 8.29% | 9.82 |
| CeO2 | 100% | 7.65 | 0.0334% | 0.02 | 0.16% | 0.1865 |

**WB4101 is an acrylic binder with additives solution. DF002 is a non-silicone de-foamer. DS001 is a polymeric dispersant. PL005 is a high pH plasticizer. These organic chemicals are specifically formulated for aqueous ceramic tape casting by Polymer Innovations, Inc, of Vista, California.

A batch containing only YAG:Ce powder or a mixture of yttria, alumina, and ceria, either with or without Gd, is processed into ceramic plates. After milling, for a length of time long enough to promote a good green microstructure (well-mixed, well-packed small powder particles with a fine and narrow distribution of void sizes between the particles), the pore-forming additives are added to the batch which is further mixed for a period only long enough to distribute the additive. At that point, the batch is then cast, dried, and cut or punched into the desired part size and shape. The desired shape for a sintered ceramic converter plate is typically about 1 mm×1 mm square with a thickness of 70 to 150 microns. One corner of the plate is typically cut out to provide room for a wire bond to the top surface of the LED chip. The size could be as small as 0.5 mm square for smaller LED chips.

The green parts are placed on an alumina setter plate which is then placed in an air atmosphere furnace and heated using a typical time-temperature cycle of:

25° C. to 400° C. in 4 hours
400° C. to 1150° C. in 4 hours
Hold at 1150° C. for a period of from 0.5 to 2 hours
Cool to 25° C. in 3 hours This thermal process removes all of the organic and carbonaceous species including the organic binders used to hold the powders together as well as the pore-forming additive materials. The hold temperature at 1150° C. is also high enough to allow the powder particles to neck together giving the parts sufficient strength to be handled. The pore-forming additives are burnt out leaving voids that replicate their sizes and shapes.

The pre-fired ceramic plates are transferred onto molybdenum plates and are sintered in a wet hydrogen atmosphere at 1700-1825° C. for a period of from 1 minute to 2 hours at peak temperature. During the hydrogen sintering, the plates shrink as the ceramic powders sinter and the matrix porosity is removed. If the initial powder particle sizes and mixing/milling conditions are performed properly and no pore-forming additives are added to the batch, the matrix porosity will be reduced at elevated sintering temperatures to a level that the part exhibits a high degree of transparency or translucency.

While there have been shown and described what are at present considered to be preferred embodiments of the invention, it will be apparent to those skilled in the art that various changes and modifications can be made herein without departing from the scope of the invention as defined by the appended claims. In particular, while a preferred embodiment described herein is for tape cast ceramics made with Ce in the YAG host, the invention may be extended to other luminescent ceramic materials and ceramic forming techniques such as injection molding, slip casting, die pressing, etc. The addition of pore-forming additives can be employed in all various ceramic forming techniques.

We claim:

1. A method of forming a luminescent ceramic converter comprising the steps of:
   (a) combining a precursor material with a pore-forming additive to form a green state mixture, the pore-forming additive comprising substantially spherical particles of a carbonaceous material comprising a glassy spherical carbon powder;
   (b) shaping the green state mixture to form a green state shape of the ceramic converter;
   (c) heating the green state shape to remove the pore-forming additive and form a pre-fired ceramic material having substantially spherically shaped pores; and
   (d) sintering the pre-fired ceramic material to form the luminescent ceramic converter.

2. The method of claim 1 wherein the precursor material comprises cerium-activated yttrium aluminum garnet.

3. The method of claim 1 wherein the green state mixture further contains an organic binder.

4. The method of claim 1 wherein the green state shape is formed by injection molding, tape casting, dry pressing, slip casting, or extrusion.

5. The method of claim 1 wherein the organic material is a polymer.

6. The method of claim 1 wherein the green state mixture contains more than one precursor material and heating of the green state shape causes the precursor materials to react to form the luminescent ceramic converter.

7. The method of claim 1 wherein the heating in step (c) is performed at a temperature up to 1150° C.

8. The method of claim 7 wherein the heating in step (c) is performed at a time-temperature cycle of: increasing temperature from 25° C. to 400° C. in 4 hours, increasing temperature from 400° C. to 1150° C. in 4 hours, holding the temperature at 1150° C. for a time period ranging from 0.5 to 2 hours, and decreasing the temperature to 25° C. in 3 hours.

9. The method of claim 1 wherein the sintering is performed at a temperature in a range of 1700° C.-1825° C.

10. The method of claim 1 wherein the pre-fired ceramic material is sintered in a wet hydrogen atmosphere at 1700° C.-1825° C. for a time period ranges from 1 minute to 2 hour, after step (c).

* * * * *